United States Patent
Crippen et al.

(10) Patent No.: US 7,251,135 B2
(45) Date of Patent: Jul. 31, 2007

(54) EASY RELEASE SERVER COOLING FAN WITH INTEGRATED SPRING AND METHOD FOR USING SAME

(75) Inventors: Martin Joseph Crippen, Apex, NC (US); Karl Klaus Dittus, Durham, NC (US); Timothy Andreas Meserth, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 145 days.

(21) Appl. No.: 11/223,875

(22) Filed: Sep. 8, 2005

(65) Prior Publication Data

US 2007/0053159 A1    Mar. 8, 2007

(51) Int. Cl.
*H05K 7/20* (2006.01)
(52) U.S. Cl. ............... 361/695; 361/694; 361/697; 165/121; 165/122; 165/104.33; 165/104.34; 454/184; 417/423.5; 417/423.14; 417/423.15
(58) Field of Classification Search ............... 361/687, 361/692–697, 721–727, 732, 740, 747, 756, 361/802; 165/80.31, 121–126, 104.33, 104.34; 454/184; 417/360, 423.5–423.15; 174/16.1, 174/16.3; 416/244 R, 247 R
See application file for complete search history.

(56) References Cited

U.S. PATENT DOCUMENTS

| | | | |
|---|---|---|---|
| 5,835,347 A | 11/1998 | Chu | 361/697 |
| 6,373,698 B1 * | 4/2002 | Christensen | 361/695 |
| 6,375,440 B2 * | 4/2002 | Kosugi | 417/423.14 |
| 6,435,889 B1 * | 8/2002 | Vinson et al. | 439/247 |
| 6,556,437 B1 | 4/2003 | Hardin | 361/687 |
| 6,603,661 B2 * | 8/2003 | Smith et al. | 361/695 |
| 6,616,525 B1 * | 9/2003 | Giraldo et al. | 454/184 |
| 6,633,486 B2 * | 10/2003 | Coles et al. | 361/726 |
| 6,663,416 B2 * | 12/2003 | Huang et al. | 439/485 |
| 6,690,576 B2 * | 2/2004 | Clements et al. | 361/695 |
| 6,793,348 B2 | 9/2004 | Lee et al. | 353/119 |
| 6,795,314 B1 * | 9/2004 | Arbogast et al. | 361/695 |
| 7,002,796 B2 * | 2/2006 | Lao et al. | 361/695 |
| 7,054,155 B1 * | 5/2006 | Mease et al. | 361/695 |
| 2003/0112601 A1 | 6/2003 | Smith et al. | 361/695 |

* cited by examiner

*Primary Examiner*—Michael Datskovskiy
(74) *Attorney, Agent, or Firm*—Harrington & Smith, PC

(57) ABSTRACT

A fan assembly formed of a fan, at least one fan grill comprising a face panel and at least one side panel comprising a spring slot the fan grill coupled to the fan, and a spring coupled to the fan grill the spring comprising a spring driver end extending through the spring slot.

20 Claims, 4 Drawing Sheets

EASY RELEASE SERVER COOLING FAN WITH INTEGRATED SPRING AND METHOD FOR USING SAME

TECHNICAL FIELD

This invention relates generally to a device for facilitating the release of server cooling fans.

BACKGROUND

Industry trends toward miniaturization of computer solutions have led development engineers to cram more and more components into limited physical space. Rack mounted servers are especially subject to such space constraints. In such servers, it is not uncommon to configure up to twelve cooling fans in an array of six fans across by two fans deep so as to form a line of cooling fans across the width of the server chassis.

Such cooling fans operate under relatively extreme conditions and, as such, are subject to failure. In the event of one such failure, it is important to quickly replace the inoperable fan. As it is undesirable to stop the functioning of the server when performing such a replacement, replacements of this nature are typically hot swaps. A "hot swap" is a replacement that does not require ceasing the operation of the server in which the fan is to be replaced.

Various forms of fan connectors are employed to secure cooling fans to the chassis or other anchoring element of a server. Typically, these connectors require that an upward force be applied to the cooling fan in order to facilitate separation of the cooling fan. Often times, separation is attempted after engaging a release mechanism to disconnect a fan connector. Once such a release mechanism is engaged, it is necessary to apply an upward force, or unmate force, of approximately 6.2 pounds of force (lbf) to overcome residual friction between the fan connector and the chassis component to which the fan is coupled.

There exists limited space for combination release latching mechanisms/grip points that are easy to activate and grip with enough force to overcome the unmate force required for fan removal. There is therefore a need for a server cooling fan mechanism that facilitates the separation of the fan from a chassis component in a hot swap mode.

SUMMARY OF THE PREFERRED EMBODIMENTS

In accordance with an exemplary embodiment of the invention a fan assembly is formed of a fan, at least one fan grill formed of a face panel and at least one side panel formed of a spring slot the fan grill coupled to the fan, and a spring coupled to the fan grill the spring formed of a spring driver end extending through the spring slot.

In an alternative exemplary embodiment of the invention, a cooling array is formed of a plurality of fan assemblies each formed of a fan, at least one fan grill formed of a face panel and at least one side panel formed of a spring slot the fan grill coupled to the fan, and a torsion spring coupled to the fan grill the torsion spring formed of a spring driver end extending through the spring slot, wherein each of the plurality of fan assemblies is formed of at least one side in contact with at least one side of at least one other one of the plurality of fan assemblies.

A method for removing a cooling fan comprises providing a cooling fan comprising a fan, at least one fan grill comprising a face panel and at least one side panel comprising a spring slot the fan grill coupled to the fan, and a torsion spring coupled to the fan grill the torsion spring comprising a spring driver end extending through the spring slot, wherein the fan is coupled to a chassis component via a locking mechanism and the spring driver end is compressed by the chassis component to produce a spring force away from the chassis component, releasing the locking mechanism, and utilizing the spring force to facilitate a decoupling of the cooling fan from the chassis component.

BRIEF DESCRIPTION OF THE DRAWINGS

The foregoing and other aspects of these teachings are made more evident in the following Detailed Description, when read in conjunction with the attached Drawing Figures, wherein.

DETAILED DESCRIPTION

In an exemplary and non-limiting embodiment of the invention, a spring is integrated into the construction of a server component to provide an unmate force to aid in the separation of the server component from the server chassis. While described herein with reference to a spring integrated into a server cooling fan for facilitating the hot swapping of the server cooling fan, the invention is not so limited. Rather, the invention is drawn broadly to encompass any and all server or computer components which, in a hot swap mode, require the provision of a force away from the chassis component to which they are coupled. With reference to a server cooling fan, as is described more fully below, the spring is preferably formed of a torsion spring that is situated in a space between the fan grill and the fan. A driver end of the spring protrudes through a slot in the fan grill. When placed against a server chassis or other anchoring component, the driver end of the spring is compressed, or torqued, so as to provide a force directed away from the anchoring component.

Figure 1:
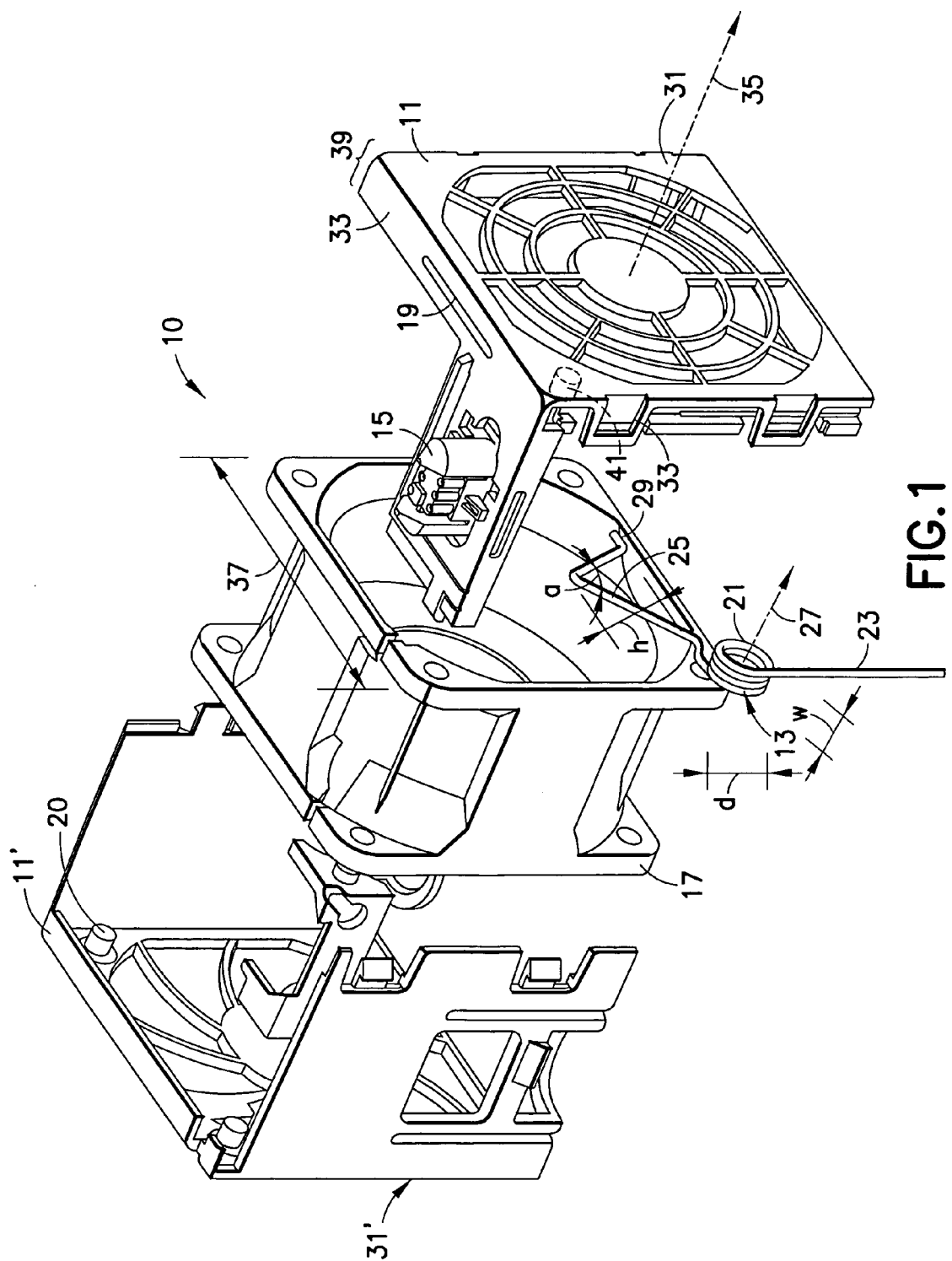
FIG. 1. is an exploded diagram of an exemplary embodiment of a server cooling fan of the invention.

With reference to FIG. 1, there is illustrated an exploded illustration of an exemplary embodiment of the invention. Server cooling fan 10 is formed, generally, of a fan 17 around which is assembled a first fan grill 11 and a second fan grill 11'. When assembled, the fan grills 11, 11' are coupled to each other so as to form a generally cubic, or square prism structure, predominantly encapsulating the fan 17. Each fan grill 11, 11' is formed of a generally planar face panel 31, 31'. Face panels 31, 31' are preferably square with each side extending for a distance not appreciably greater than a fan diameter 37 aligned along the fan blade's (not shown) plane of rotation.

When configured to be operable, both fan grills 11, 11' and fan 17 are coupled such that both face panels 31, 31' and the fan 17 plane of rotation are generally parallel and perpendicular to fan axis 35. Extending away from face panel 31 towards the fan 17 along fan axis 35 is one or more side panels 33, 33'.

As illustrated, side panels 33, 33' extend for a distance equal to the fan grill offset 39. Exemplary values for the fan grill offset 39 range from approximately one to eight mm. When coupled to the fan 17, the side panels 33, 33' create a space bounded by the face panel 31 and the side panels 33, 33' and of a depth equal to the fan grill offset 39 sufficient to provide for the housing of the spring 13. One side panel 33 is perforated by a spring slot 19. Spring slot 19 extends along side panel 33 in a direction perpendicular to fan axis 35 and is terminated at either end by a portion of side panel 33. As a portion of the spring 13 will extend from within the fan grill 11 through the spring slot 19, spring slot 19 is of a width that is at least as wide as the wire from which the spring 13 is fashioned.

Spring 13 is preferably a torsion spring. As such, spring 13 is formed of a single wire having, at a first terminus, a spring attachment end 23 and, at a second terminus, a spring driver end 25. Between the spring attachment end 23 and the spring driver end 25 is a spring coil 21 formed of a plurality of coils, or turns, of the wire forming spring 13. Spring coil 21 is formed about a spring axis 27 and extends for a distance equal to a spring coil width w. Spring coil width w is approximately equal to an integer multiple of the width of the wire forming spring 13 and is less than or equal to fan grill offset 39. Spring coil 21 has a spring coil diameter d.

As is described more fully below, spring attachment end 23 extends away from spring coil 21 and serves, when spring driver end 25 is compressed, to transfer force to an inner side of side panel 33'. Spring driver end 25 is terminated by a spring catch 29. Spring catch forms a portion of spring driver end 25. Spring catch 29 extends, when the spring driver end 25 is uncompressed, generally perpendicular to spring attachment end 23 away from spring coil 21. Between the spring coil 21 and the spring catch 19, spring driver end 25 deviates by a height h from the otherwise straight line along which spring catch 29 extends. Therefore, in a static, or uncompressed state, spring driver end 25 extends generally perpendicular to spring attachment end 23 along a straight line with the exception of the deviation by height h.

In a preferred exemplary embodiment, this deviation is in the form of an angle α bounded on either side by generally straight portions of spring driver end 25. As is described more fully below, height h forms an upper bound on the maximum linear displacement of spring driver end 25 when mated to a chassis component.

Spring fastener 41 protrudes from an inner surface of face panel 31. In the exemplary embodiment shown, spring fastener 41 is formed of a predominantly cylindrical protrusion of a diameter slightly less than spring coil diameter d and extending for a distance approximately equal to spring coil width w. As a result, the spring coil 21 can be snugly inserted over and about spring fastener 41 allowing spring attachment end 23 to extend along a side panel 33' while allowing spring driver end 25 to protrude from spring slot 19. While illustrated with respect to a cylindrical spring fastener 41, spring fastener 41 may be any component, including, but not limited to an adhesive or a fabricated recess, capable of securely maintaining a position of spring coil 21 when spring driver end 25 is compressed.

Figure 2:
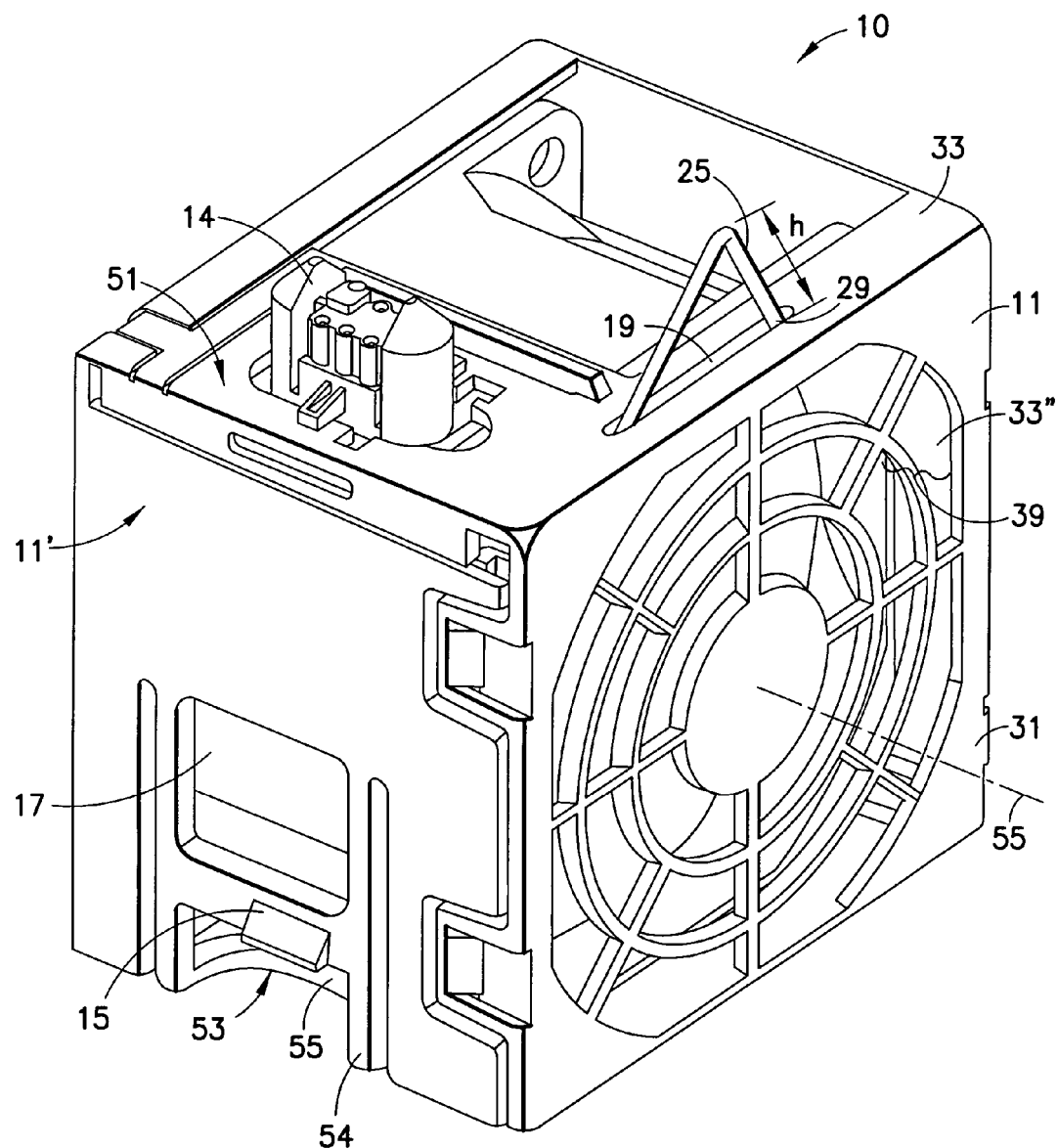
FIG. 2 is an illustration of an exemplary embodiment of a server cooling fan of the invention in an unmated configuration.

With reference to FIG. 2 there is illustrated an exemplary embodiment of an assembled server cooling fan 10. Fan grills 11, 11' are coupled with fan 17 to form an integrated whole wherein the fan grills 11, 11' serve to largely surround and protect fan 17. Fan grills 11, 11' are coupled via a snap lock connection. Fan 17 receives one or more bosses 20 coupled to fan grills 11, 11' in order to interlock the fan 17 and fan grill 11, 11' components. Note that the extension of side panel 33" a distance of the fan grill offset 39 creates a space between face panel 31 and the fan 17 into which is situated the spring 13. Spring driver end 25 extends through spring slot 19 outside of fan grill 11 a distance slightly less than height h. When spring driver end 25 is in an uncompressed configuration, spring catch 29 interfaces with an inner surface of side panel 33 extending beyond spring slot 19 to prevent unwanted angular displacement of the terminus of spring driver end 25 outside of fan grill 11. Were such unwanted displacement to occur, a misalignment of spring driver end 25 with spring slot 19 in an uncompressed configuration could result in damage to the spring driver end 25 when mated to a chassis component.

Spring driver end 25 therefore resides in a plane extending from spring slot 19 in a direction generally perpendicular to fan axis 35 and generally parallel to face panel 31. Electrical connector 14 extends from a generally planar side 51 of server cooling fan 10. When mated to a chassis component, electrical connector 14 serves to provide electrical power to the server cooling fan 10. A locking mechanism 53 is formed of a deflectable cantilevered arm 54 with a latch surface 15 and a finger contact surface 55. When coupled to an adjacent server cooling fan 10 or chassis component, latch surface 15 serves to prevent the movement of the server cooling fan 10 away from the chassis component to which it is mated. When the locking mechanism 53 is disengaged, typically by applying a force with one's fingers to the deflectable cantilevered arm 54, latch surface 15 is disengaged. Once disengaged, an unmate force approximately equal to or greater than six ponds of force is required to overcome residual friction between the electrical connection and the chassis component to which the server cooling fan 10 is attached. There are numerous such locking mechanisms 53 known in the art. The actual configuration and operation of such locking mechanisms 53 is not material to the operation of the invention. It suffices that such locking mechanisms 53, acting in concert, provide a secure attachment to a chassis component when engaged, and require the application of an unmate force to overcome residual friction when disengaged.

Figure 3:
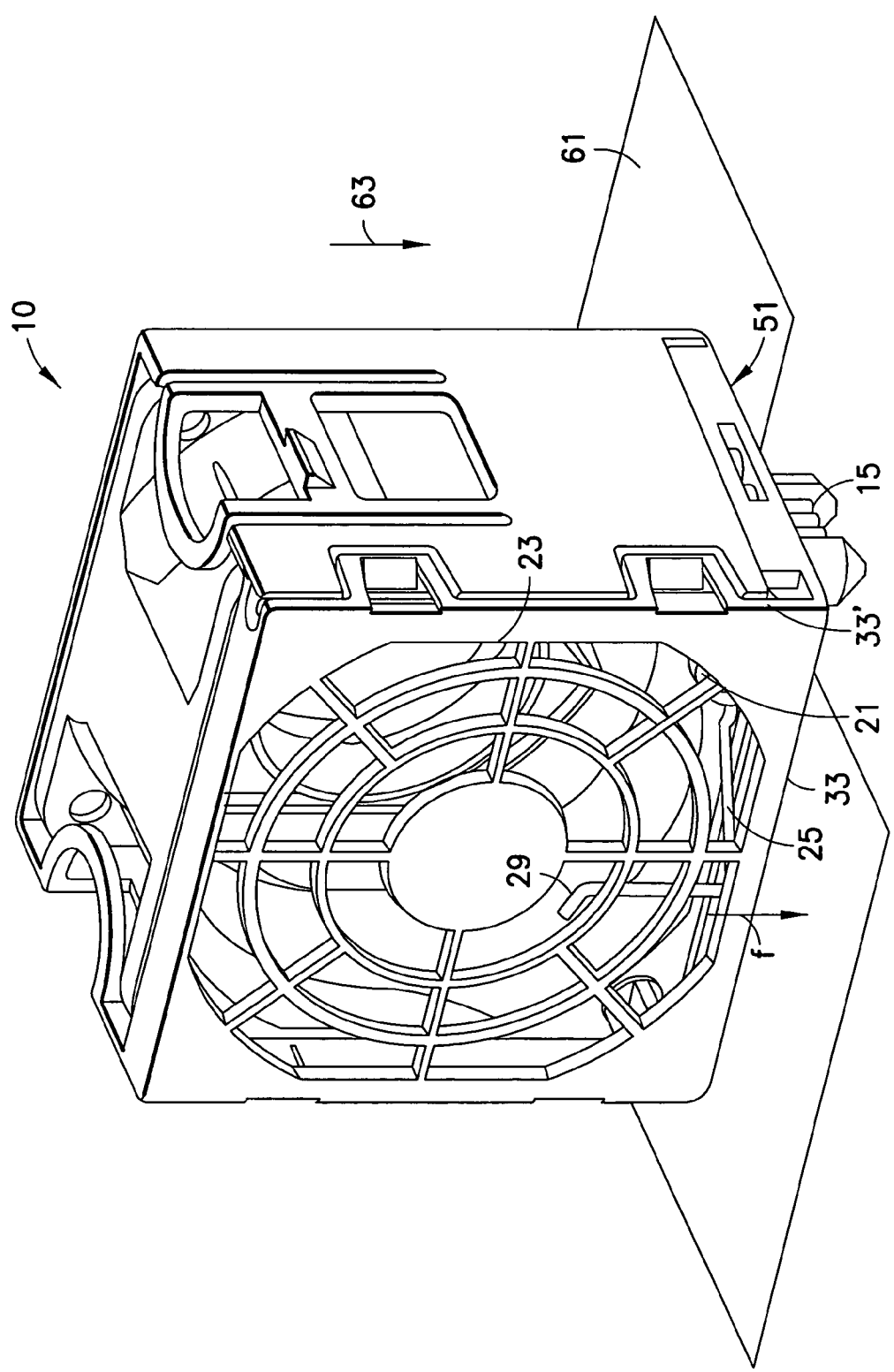
FIG. 3 is an illustration of an exemplary embodiment of a server cooling fan of the invention in a mated configuration.

With reference to FIG. 3, there is illustrated an exemplary embodiment of the server cooling fan 10 mated to a chassis component 61. Chassis component 61 is illustrated in cut away fashion for the purpose of showing electrical connector 15 which would be otherwise obscured. While illustrated as coupled, or otherwise attached via locking mechanism 15, to a chassis component 61, server cooling fan 10 can be coupled to any surface, preferably a generally planar surface, that permits the operation of locking mechanism 15 and provides a surface against which spring driver end 25 can exert a force. Note that spring driver end 25 is angularly displaced about spring coil 21 into a compressed position. In the compressed position, the spring driver end 25 does not extend beyond side panel 33. This angular displacement is the result of a compression of the spring driver end 25 arising from contact with the chassis component 61 as the server cooling fan 10 is pushed into a locked position wherein locking mechanism 15 is engaged. Note further that generally planar side 51 is in close contact to chassis component 61.

As the server cooling fan 10 is directed in a locking direction 63 generally perpendicular to the generally planar surface of chassis component 61, spring driver end 25 is rotationally displaced as described above and illustrated here. The resulting torque applied to spring 13 results in a downward spring force f applied by the spring driver end 25 to the chassis component. It is preferred that the spring force f generated by spring 13 via the spring driver end 25 be less than the unmate force required to separate the server cooling fan 10 from the chassis component 61 after disengaging the locking mechanism 53. When this condition is met, disengaging the locking mechanism 53 does not result in separation of the server cooling fan 10 from the chassis component. Rather, spring force f partially offsets the required unmate force and therefore reduces the unmate force required to remove the server cooling fan 10. In addition, spring 13 biases the fan assembly upward to firmly seat the assembly in its latched position so as to reduce vibration.

Preferred values for spring force f range from approximately sixty percent of the unmate force to approximately ninety-five percent of the unmate force. In practice, a spring force f from approximately three ponds of force (lbf) to six lbf is preferred. The amount of spring force f generated when the spring driver end is rotationally displaced is dependent upon a variety of variables including, but not limited to, the number of individual coils forming spring coil 21, the diameter of the spring coil 21, and the material out of which the spring 13 is formed. In exemplary implementations of the invention, there are utilized between three and six coils forming a spring coil formed of a single wire fabricated from stainless steel or music wire. When adapting the invention to a particular implementation, it is well known to select parameters for constructing spring 13 such that a desired spring force f is produced.

Figure 4:
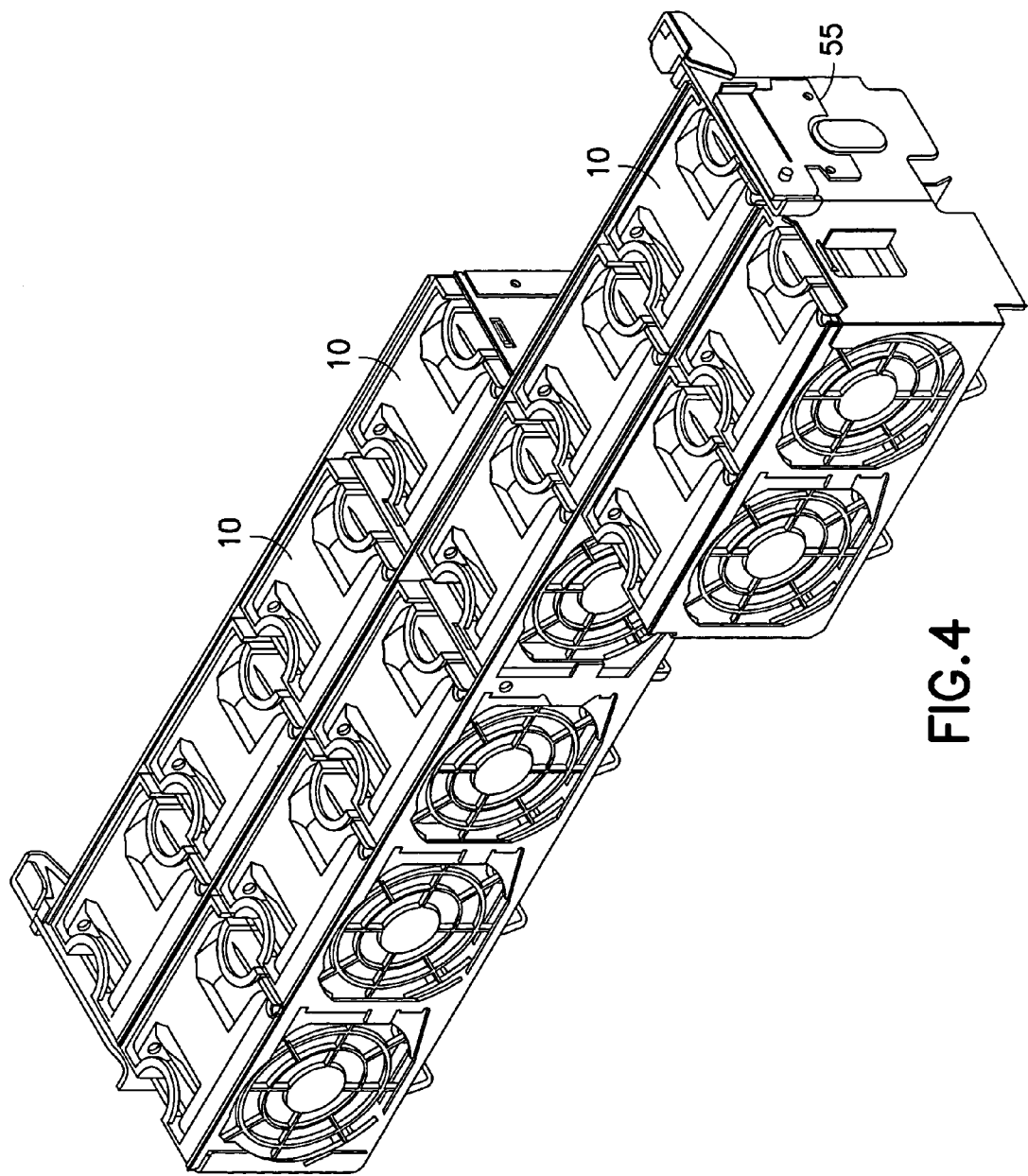
FIG. 4 is an illustration of an exemplary embodiment of a plurality of server cooling fans of the invention configured in an array.

With reference to FIG. 4 there is illustrated an exemplary embodiment of a plurality of server cooling fans 10 arranged in a compact array for attachment to a chassis component. Note that each server cooling fan 10 is in contact with at least one other server cooling fan 10 along at least one side 55 of each server cooling fan 10.

Although described in the context of particular embodiments, it will be apparent to those skilled in the art that a number of modifications and various changes to these teachings may occur. Thus, while the invention has been particularly shown and described with respect to one or more exemplary embodiments thereof, it will be understood by those skilled in the art that certain modifications or changes may be made therein without departing from the scope and spirit of the invention as set forth above, or from the scope of the ensuing claims.

What is claimed is:

1. A fan assembly comprising:
   a fan;
   at least one fan grill comprising a face panel and at least one side panel comprising a spring slot, said fan grill coupled to said fan; and
   a spring coupled to said fan grill, said spring comprising a spring driver end extending through said spring slot.

2. The fan assembly of claim 1 where in said spring is a torsion spring.

3. The fan assembly of claim 2 wherein said torsion spring further comprises a spring coil and a spring attachment end.

4. The fan assembly of claim 3 wherein said spring coil is located between said face panel and said fan.

5. The fan assembly of claim 1 wherein said spring driver end generates a spring force generally perpendicular to and away from said spring slot when said spring driver end is compressed.

6. The fan assembly of claim 5 wherein said spring force is between approximately 3.0 and 6.0 pounds of force (lbf).

7. The fan assembly of claim 5 comprising an unmate force.

8. The fan assembly of claim 7 wherein said spring force is less than said unmate force.

9. The fan assembly of claim 1 comprising a locking mechanism.

10. The fan assembly of claim 2 wherein said torsion spring is coupled to said fan grill via a spring fastener.

11. The fan assembly of claim 1 wherein said fan assembly comprises a server cooling fan.

12. The fan assembly of claim 1 wherein said spring driver end comprises a spring catch.

13. A cooling array comprising:
   a plurality of fan assemblies each comprising:
      a fan;
      at least one fan grill comprising a face panel and at least one side panel comprising a spring slot, said fan grill coupled to said fan; and
      a spring coupled to said fan grill, said spring comprising a spring driver end extending through said spring slot,
      wherein each of said plurality of fan assemblies comprises at least one side in contact with at least one side of at least one other one of said plurality of fan assemblies.

14. The cooling array of claim 13 wherein said spring comprises a torsion spring.

15. The fan assembly of claim 14 wherein said torsion spring further comprises a spring coil and a spring attachment end.

16. The cooling array of claim 15 wherein said spring coil is located between said face panel and said fan.

17. The cooling array of claim 13 wherein said spring driver end generates a spring force generally perpendicular to and away from said spring slot when said spring driver end is compressed.

18. The cooling array of claim 17 wherein said spring force is between approximately 3.0 and 6.0 pounds of force (lbf).

19. A method for removing a cooling fan comprising:
   providing a cooling fan comprising:
      a fan;
      at least one fan grill comprising a face panel and at least one side panel comprising a spring slot said fan grill coupled to said fan; and
      a spring coupled to said fan grill said spring comprising a spring driver end extending through said spring slot;
      wherein said fan is coupled to a chassis component via a locking mechanism and said spring driver end is compressed by said chassis component to produce a spring force away from said chassis component;
   releasing said locking mechanism; and
   utilizing said spring force to facilitate a decoupling of said cooling fan from said chassis component.

20. The method of claim 19 wherein said cooling fan comprises a server cooling fan.

* * * * *